(12) United States Patent
Park et al.

(10) Patent No.: US 8,278,813 B2
(45) Date of Patent: Oct. 2, 2012

(54) APPARATUS AND METHOD FOR GENERATING FEMTOSECOND ELECTRON BEAM

(75) Inventors: Yong Woon Park, Pohang-si (KR); Hyotcherl Ihee, Yuseong-gu (KR); Chang Bum Kim, Gyeongsangbuk-do (KR); In Soo Ko, Pohang-si (KR)

(73) Assignee: POSTECH Academy-Industry Foundation, Pohang (KR)

( * ) Notice: Subject to any disclaimer, the term of this patent is extended or adjusted under 35 U.S.C. 154(b) by 161 days.

(21) Appl. No.: 12/481,995

(22) Filed: Jun. 10, 2009

(65) Prior Publication Data

US 2010/0117510 A1  May 13, 2010

(30) Foreign Application Priority Data

Nov. 10, 2008 (KR) ........................ 10-2008-0111238

(51) Int. Cl.
*H01J 29/46* (2006.01)
(52) U.S. Cl. ...................................................... 313/441
(58) Field of Classification Search .................. 313/441, 313/452, 107.5, 360.1–363.1
See application file for complete search history.

(56) References Cited

U.S. PATENT DOCUMENTS

| | | | | |
|---|---|---|---|---|
| 4,323,808 A | * | 4/1982 | Davis | 310/306 |
| 5,371,371 A | | 12/1994 | Yamazaki et al. | |
| 5,684,360 A | * | 11/1997 | Baum et al. | 313/542 |

FOREIGN PATENT DOCUMENTS

| | | |
|---|---|---|
| CN | 100423170 | 4/2005 |
| GB | 1513413 | 6/1978 |
| JP | 56050029 | 10/1979 |
| JP | 01161643 | 12/1987 |
| KR | 97-005769 | 4/1997 |

OTHER PUBLICATIONS

Korean Office Action for Application 10-2008-0111238.
Aug. 19, 2011 Office Action issued by the Canadian Intellectual Property Office in connection with Canadian Patent Application No. 2,669,626.
May 24, 2012 Office Action issued by the Canadian Intellectual Property Office in connection with Canadian Patent Application No. 2,669,626.

* cited by examiner

*Primary Examiner* — Anh Mai
*Assistant Examiner* — Andrew Coughlin
(74) *Attorney, Agent, or Firm* — Occhiuti Rohlicek & Tsao LLP

(57) ABSTRACT

An apparatus and method for generating femtosecond electron beam are disclosed. The apparatus for generating electron beam by discharging an electron generated via a cathode to an anode includes a transmission window provided at one side of the cathode to allow incident laser to pass therethrough, a pinhole formed on the anode such that the pinhole corresponds to the position of the electron generated from the transmission window, and a focusing unit provided at one side of the cathode and generating an electric field to accelerate and at the same time concentrate the electron to the pinhole. Electrons are simultaneously concentrated and accelerated to the pinhole by an electric field generated by the focusing unit positioned at the cathode to generate femtosecond electron beam.

23 Claims, 5 Drawing Sheets a)

b)

c)

APPARATUS AND METHOD FOR GENERATING FEMTOSECOND ELECTRON BEAM

CROSS-REFERENCE TO RELATED APPLICATIONS

This application claims the benefit of priority of Korean Patent Application No. 10-2008-0111238 filed on Nov. 10, 2008 which is incorporated by reference in its entirety herein.

BACKGROUND OF THE INVENTION

1. Field of the Invention

The present invention relates to an apparatus and method for generating electron beam and, more particularly, to femtosecond electron beam generating apparatus and method capable of generating femtosecond electron beam.

2. Description of the Related Art

As the scientific technology is advancing, an electron gun is used to detect chemical or physical properties of objects. The electron gun, which refers to a device for generating electrons in the form of fine beams, is employed for electron microscopes, traveling-wave tubes, Braun tubes, cyclotrons, and the like, to detect the characteristics of target objects.

The related art electron gun generally accelerates electrons generated from a cathode by using a grid, allows the electrons to pass through a pinhole formed at an anode, and concentrates the electrons which have passed through the pinhole by using a magnetic lens or the like to generate electron beams.

However, concentration and acceleration of the electrons by using the grid, magnetic lens, or the like, lead to an increase in the length of the electron gun due to the lengths of the grid, the magnetic lens, or the like. The increase in the length of the electron gun lengthens the distance between the cathode and a sample, which disadvantageously results in elongation (i.e., time duration: pulse length or pulse width) of electron beam due to a space charge effect.

The magnetic lens has problems in that it can hardly supply stably such current as to generate high quality electron beam, it needs cooling water for its cooling, and it has an intrinsic optical aberration, or the like, complicating the fabrication of an electron gun, and making it difficult to generate high quality electron beam.

With such problems, the related art electron gun generates electron beam with a duration of picosecond ($10^{-12}$), but not femtosecond electron beam. Thus, in order to detect the characteristics of various materials, an apparatus and method for generating electron beams with a duration of femtosecond ($10^{-15}$) is required.

SUMMARY OF THE INVENTION

Therefore, an object of the present invention is to provide an apparatus and method for providing electron beams with femtosecond duration.

To achieve the above object, in one aspect, there is provided an apparatus for generating electron beam by discharging an electron generated via a cathode to an anode, including: a transmission window provided at one side of the cathode to allow incident laser to pass therethrough; a pinhole formed on the anode such that the pinhole corresponds to the position of the electron generated from the transmission window; and a focusing unit provided at one side of the cathode and generating an electric field to accelerate and at the same time concentrate the electron to the pinhole.

The focusing unit may be an electrostatic lens.

The electrostatic lens may be provided at an angle of 55° with the cathode when the distance between the cathode and a sample is 1 cm.

To achieve the above object, in another aspect, there is provided a method for generating electron beam by discharging an electron generated via a cathode to an anode, including: positioning a focusing unit that generates an electric field at one side of the cathode to accelerate and concentrate electrons generated from a transmission window formed at the cathode by using the electric field; and discharging the accelerated and concentrated electrons via a pinhole formed at the anode.

The focusing unit may be an electrostatic lens.

The electrostatic lens may be provided at an angle of 55° with the cathode when the distance between the cathode and a sample is 1 cm.

According to the present invention, the apparatus for generating femtosecond electron beams has the advantage that the focusing unit such as an electrostatic lens provided at one side of the cathode concentrates and at the same time accelerates the electrons generated from the cathode to the pinhole, to thus easily generate femtosecond electron beam of high quality.

BRIEF DESCRIPTION OF THE DRAWINGS

The present invention will become more fully understood from the detailed description given hereinbelow and the accompanying drawings, which are given by illustration only, and thus are not limitative of the present invention, and wherein:

FIG. 4a is a graph of the durations of measured electron beams over the distance from the cathode in femtosecond electron beam generating apparatus according to an embodiment of the present invention.

FIG. 4b is a partial enlarged view of FIG. 4a.

DETAILED DESCRIPTION OF THE PREFERRED EMBODIMENT

The present invention will now be described more fully hereinafter with reference to the accompanying drawings. In describing the present invention, if a detailed explanation for a related known function or construction is considered to unnecessarily divert the gist of the present invention, such explanation has been omitted but would be understood by those skilled in the art.

Figure 1:
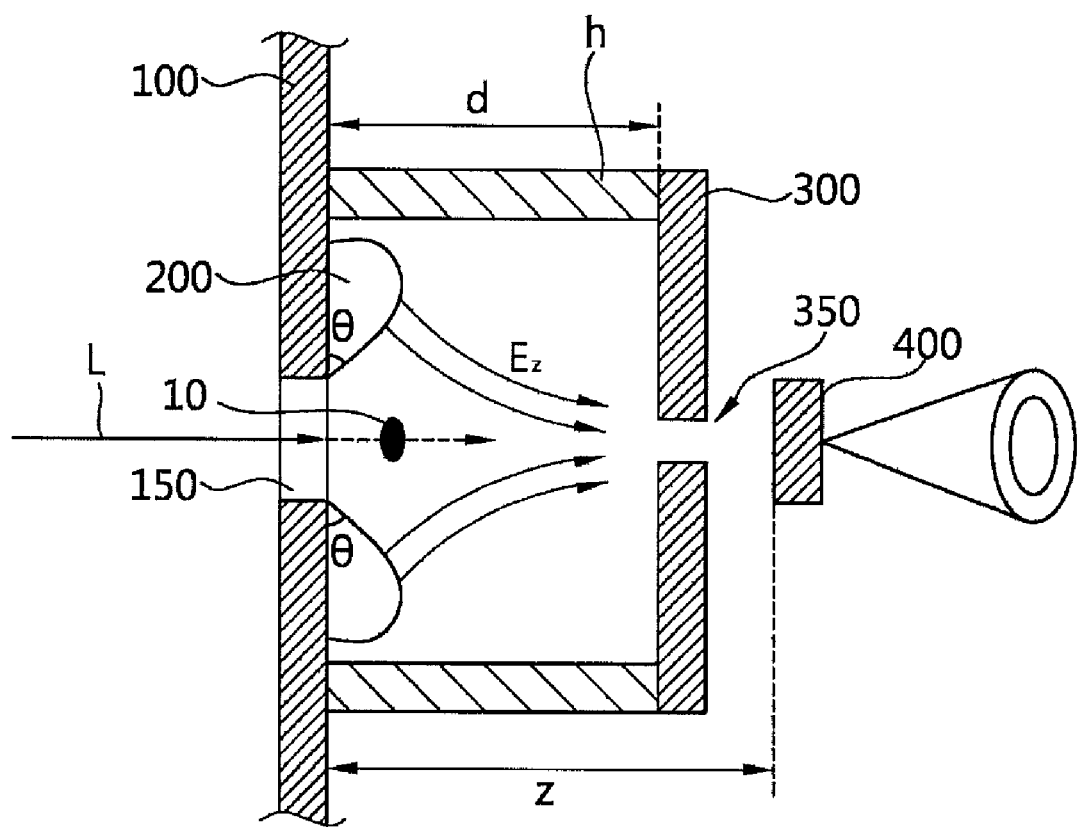
FIG. 1 is a sectional view of a femtosecond electron beam generating apparatus according to an embodiment of the present invention.
Figure 2:
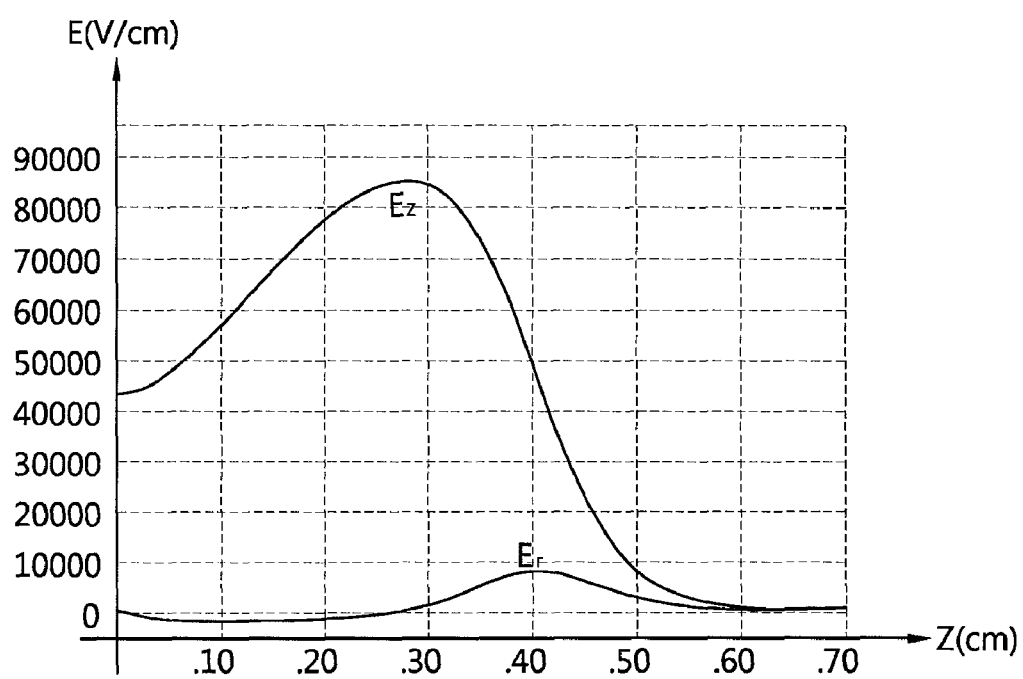
FIG. 2 is a graph of the strength of an electron field over the distance from a cathode in the femtosecond electron beam generating apparatus according to an embodiment of the present invention.

FIG. 1 is a sectional view of a femtosecond electron beam generating apparatus according to an embodiment of the present invention, and FIG. 2 is a graph of the strength of an electron field over the distance from a cathode in the femtosecond electron beam generating apparatus according to an embodiment of the present invention.

With reference to FIG. 1, the electron beam generating apparatus according to an embodiment of the present invention includes a housing (h), a cathode 100, a transmission window 150, a focusing unit 200, an anode 300, and a pinhole 350.

When voltage is applied to the electron beam generating apparatus to generate electron beam, the cathode 100 is formed at one side of the housing (h) of the electron beam generating apparatus and the anode 300 is formed at a position corresponding to the cathode 100 according to the voltage. Here, in order to easily form the cathode 100 and the anode 300, the housing (h) may be made of a dielectric material.

An electron 10 generated within the electron beam generating apparatus is made incident to the interior of the housing (h) via the cathode 100. In this case, the transmission window 150 coated with a metallic material is formed at one side of the cathode 100 to allow the electron 10 to be easily generated within the housing (h). The transmission window 150 may be made of quartz, glass, crystal, and the like.

The focusing unit 200 serves to concentrate and accelerate the electron 10 generated via the transmission window. In detail, the focusing unit 200 may be, for example, an electrostatic lens which generates an electric field $E_z$ in a radial direction to concentrate and accelerate the electron 10, which is generated as laser (L) made incident through the transmission window 150 collides with the metallic material coated on the surface of the transmission window 150, to the pinhole 350 formed at the anode 300 as shown in FIG. 2.

The anode 300 is formed at the position corresponding to the cathode 100 when voltage is applied to the electron beam generating apparatus. The anode 300 includes the pinhole 350.

The pinhole 350 is formed on the anode 300 such that it corresponds to the position of the electron 10 generated through the transmission window 150. The electron 10 concentrated and accelerated by the focusing unit 200 passes through the pinhole 350 and is then irradiated to a sample 400.

At this time, a radial electric field $E_r$ is generated in the pinhole 350 to reduce the focusing effect. For example, if the pinhole 350 is formed at a position of 5 mm away from the cathode 100, the strength of the electric field $E_r$ is measured as shown in FIG. 2.

Accordingly, the strength of the electric field $E_z$ may be regulated by adjusting the angle (θ) between the cathode 100 and the focusing unit 200 to regulate the amount of concentrated electron 10.

For example, if the distance (z) between the cathode 100 of the electron beam generating apparatus according to this embodiment and the sample 400 is 1 cm and the angle (θ) between the cathode 100 and the focusing unit 200 is 55°, 78 fs electron beam is irradiated to the sample 400.

Through such process, the electron beam discharged to the outside of the electron beam generating apparatus via the pin hole 350 has the duration of femtosecond. When the electron beam is irradiated to the sample 400, it is diffracted, and the diffracted electron beam may be measured to recognize or detect the properties of various materials.

The focusing unit 200 of the electron beam generating apparatus according to an embodiment of the present invention will now be described in more detail.

The focusing unit 200 may be formed at one side of the cathode 100, and in this case, the electron 10, which is generated as laser (L) made incident to the interior of the housing (h) after passing through the transmission window 150 provided at the cathode 100 collides with the metallic material coated on the transmission window 150, is concentrated and at the same time accelerated upon generation by the electric field $E_z$.

Referring to the related art electron beam generating apparatus having the grid for accelerating electrons at the cathode and the focusing unit such as the magnetic lens for concentrating the electrons at the cathode or at an outer side of the cathode (toward the sample from the anode), the presence of the grid and the magnetic lens leads to the structural increase in the length of the electron beam generating apparatus.

However, in the electron beam generating apparatus according to the embodiment of the present invention, because the focusing unit 200 is provided at one side of the cathode 100 to simultaneously accelerate and concentrate the electron 10, removing the necessity of the configuration such as the grid or the like, the length (d) between the cathode and the anode of the electron beam generating apparatus can be as short as about 5 mm. Accordingly, the distance (z) between the cathode and the sample can be minimized.

Therefore, the electron beam generating apparatus according to the embodiment of the present invention has the structure of generating femtosecond electron beam with a shorter duration than that of the electron beam in the picosecond unit.

In the following description, the case where the initial laser (L) duration at the cathode is 30 fs, the voltage between the anode and the cathode is 30 kV, the distance (d) between the anode and the cathode is 5 mm, the angle (θ) between the electrostatic lens and the cathode is 55°, and the radius of the cathode is 2.5 mm will now be taken as an example.

Figure 3:
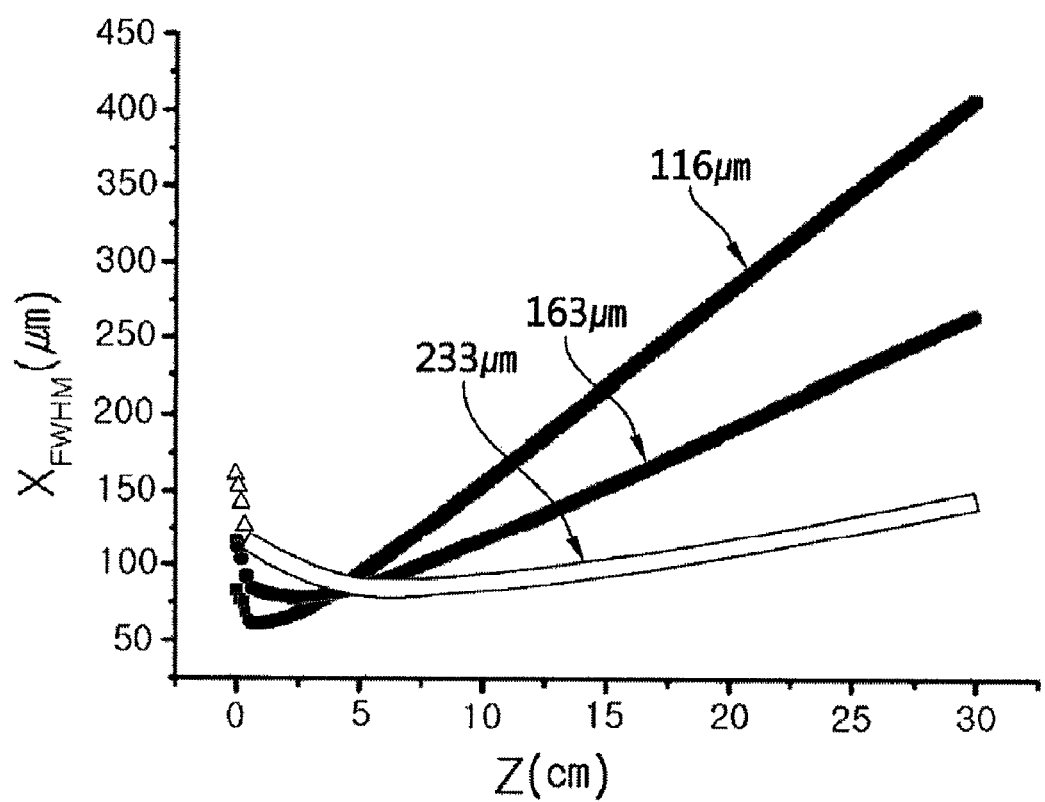
FIG. 3 is a graph of the size of measured electron beams over the distance from the cathode in femtosecond electron beam generating apparatus according to an embodiment of the present invention.

FIG. 3 is a graph of the size of measured electron beams over the distance from the cathode in femtosecond electron beam generating apparatus according to an embodiment of the present invention.

The divergence of electron beam may be measured according to a change in the size of the electron beam, and the size of the electron beam may be represented by a full width at half maximum (FWHM). FIG. 3 shows the results obtained by measuring the sizes of 116 μm, 163 μm, and 233 μm of the electron beams generated from the cathode according to the distance (z) from the cathode.

Each electron beam is concentrated to become gradually small by the electric field ($E_z$) generated from the focusing unit 200, and as each electron beam approaches 0.5 cm by the distance from the cathode, it becomes rapidly large due to the electric field $E_r$ generated from the pinhole 350.

As shown in FIG. 3, the electron beam with a FWHM beam size 163 μm (as indicated by a circular form) at the cathode has a divergence value of 0.745 mrad. Such low divergence means that the electrons diffused from the sample can come to a detector (not shown), without largely spreading. In the electron beam generating apparatus according to the present exemplary embodiment, if the sample 400 is positioned at the distance of 1 cm from the cathode, electrons can be generated to be made incident vertically to the sample position, so high quality small electron beam can be generated compared to the related art electron beam generating apparatus.

Thus, in case where the laser (L) duration is 30 fs, the number of electrons is 2000 to 4000, and the sample is positioned at the distance of 1 cm from the cathode, then the angle (θ) of the focusing unit 200 is made to be 55° with the cathode to allow the electrons to be made incident vertically to the sample, thereby generating electron beam of below 100 fs at the sample position.

As the divergence value of the electron beam is increased, the ring pattern measured in the diffraction experimentation is blurred, making it difficult to accurately detect the properties of materials. Thus, the quality of electron beam can be measured based on the sharpness of the circle.

Figure 4:
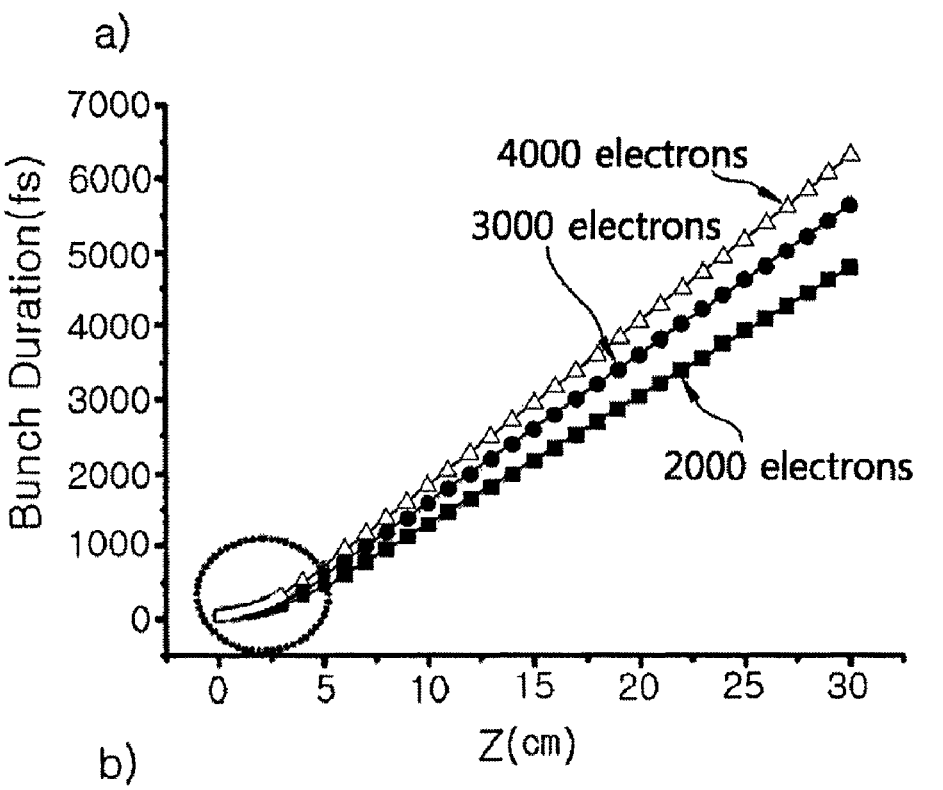
Figure 4:
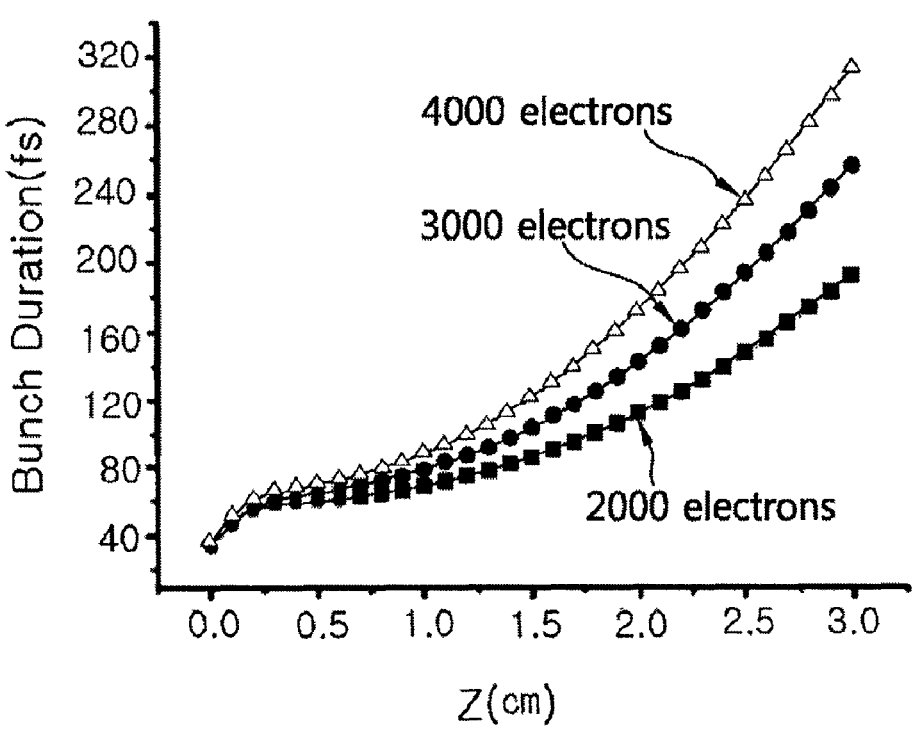

FIG. 4a is a graph of the durations of measured electron beams over the distance from the cathode in femtosecond electron beam generating apparatus according to an embodiment of the present invention, and FIG. 4b is a partial enlarged view of FIG. 4a.

As shown in FIGS. 4a and 4b, in the electron beam generating apparatus according to an embodiment of the present invention, it is noted that when electron beams are generated with 2000, 3000, and 4000 electrons at the distance (z) of 1 cm from the cathode, the durations of the electron beams are measured as scores of femtoseconds.

In case of electron beam generated with 3000 electrons, its duration was measured as 78 fs when the distance (z) from the cathode was 1 cm.

Thus, in the femtosecond electron beam generating apparatus according to the present exemplary embodiment, because the focusing unit is positioned at the cathode, electrons are accelerated and simultaneously concentrated upon generation to generate femtosecond electron beam.

In addition, because the accelerating unit such as the grid is not required, the length of the electron gun can be reduced and the distance (z) between the cathode and the sample is also shortened, thus generating high quality electron beams even with the sampler structure.

Figure 5:
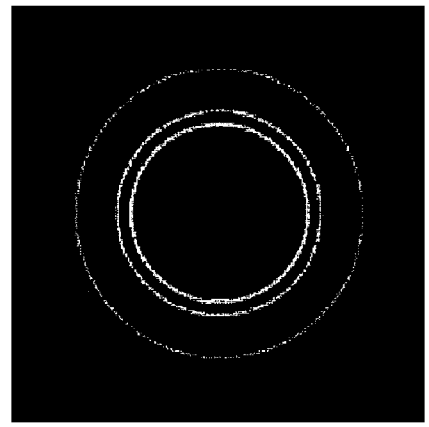
FIGS. 5a to 5c illustrate ring patterns respectively generated when electron beams with divergence values of '0', 0.745 mrad, and 3.5 mrad are diffracted.
Figure 5:
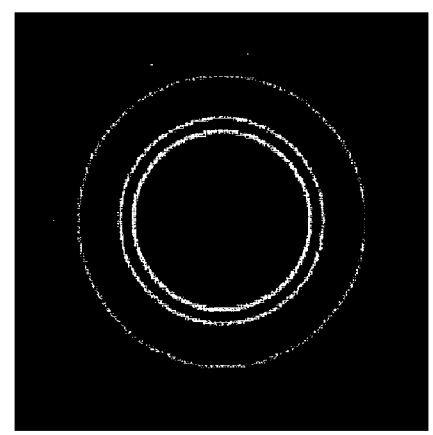
Figure 5:
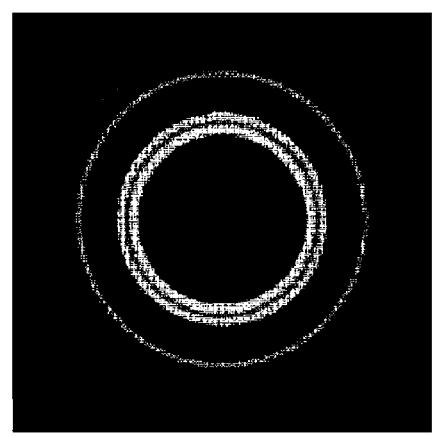

FIGS. 5a to 5c illustrate ring patterns respectively generated when electron beams with divergence values of '0', 0.745 mrad, and 3.5 mrad are diffracted.

As illustrated, when the divergence value of the electron beam is 0.745 mrad, it does not have any quality difference from the electron beam with a divergence value '0'. However, when the divergence value is 3.5 mrad, the two inner ring patterns can be hardly discriminated because of a blurring phenomenon. Thus, in the electron beam generating apparatus according to the present exemplary embodiment, it is noted that because the electron beam with the size of 163 µm has the divergence value of 0.745 mrad, the high quality electron beam is generated.

The preferred embodiments of the present invention have been described with reference to the accompanying drawings, and it will be apparent to those skilled in the art that various modifications and variations can be made in the present invention without departing from the scope of the invention. Thus, it is intended that any future modifications of the embodiments of the present invention will come within the scope of the appended claims and their equivalents.

What is claimed is:

1. An apparatus for generating electron beam, the apparatus comprising:
    a cathode, including a transmission window in the cathode to allow incident laser radiation to pass therethrough;
    an anode, including an opening in the anode positioned to receive at least a portion of an electron beam generated from a material that includes metal between the transmission window and the anode; and
    a focusing unit in electrical contact with the cathode and shaped for generating an electric field between the cathode and the anode, at least a region of the electric field in the vicinity of the electron beam having a longitudinal component parallel to a propagation axis of the electron beam and having a radial component perpendicular to the propagation axis, with the region of the electric field configured to apply a force to electrons in the electron beam towards the propagation axis to concentrate the electron beam as the electron beam propagates towards the opening, and wherein the electric field generated by the focusing unit includes a first portion having a longitudinal component and a radial component with the magnitude of the longitudinal component at least 10 times the magnitude of the radial component, and includes a second portion having a longitudinal component and a radial component with the magnitude of the radial component at least 0.2 times the magnitude of the longitudinal component.

2. The apparatus of claim 1, wherein the focusing unit is an electrostatic lens.

3. The apparatus of claim 2, wherein the electrostatic lens is provided at an angle of 55° with the cathode.

4. The apparatus of claim 1, wherein the second portion of the electric field generated by the focusing unit is closer to the anode than the cathode.

5. The apparatus of claim 4, wherein the second portion of the electric field generated by the focusing unit is located in proximity to the opening in the anode.

6. The apparatus of claim 1, wherein the first portion of the electric field is configured to accelerate electrons in the electron beam.

7. The apparatus of claim 1, wherein the second portion of the electric field is configured to concentrate the electron beam.

8. The apparatus of claim 1, wherein the distance between the cathode and the anode is less than about 0.5 cm.

9. The apparatus of claim 1, further comprising a sample positioned for at least a portion of the electron beam to be incident on the sample after propagating through the opening, with the distance between the cathode and the sample less than about 1 cm.

10. The apparatus of claim 1, wherein the electric field is configured to concentrate the electron beam to have a duration of less than about 100 femtoseconds.

11. The apparatus of claim 1, wherein the electric field is configured to limit the divergence of the electron beam to less than about 3 milliradians.

12. The apparatus of claim 1, wherein the material that includes metal comprises a coating on the transmission window.

13. A method for generating electron beam, the method comprising:
    passing laser radiation through a transmission window in a cathode;
    generating an electron beam from a material that includes metal between the transmission window and an anode;
    generating an electric field between the cathode and the anode with a focusing unit in electrical contact with the cathode, at least a region of the electric field in the vicinity of the electron beam having a longitudinal component parallel to a propagation axis of the electron beam and having a radial component perpendicular to the propagation axis, with the region of the electric field configured to apply a force to electrons in the electron beam towards the propagation axis to concentrate the electron beam as the electron beam propagates towards the opening, and wherein the electric field generated by the focusing unit includes a first portion having a longitudinal component and a radial component with the magnitude of the longitudinal component at least 10 times the magnitude of the radial component, and includes a second portion having a longitudinal component and a radial component with the magnitude of the radial component at least 0.2 times the magnitude of the longitudinal component; and
    discharging electrons from at least a portion of the electron beam through an opening in the anode.

14. The method of claim 13, wherein the focusing unit is an electrostatic lens.

15. The method of claim 14, wherein the electrostatic lens is provided at an angle of 55° with the cathode.

16. The method of claim 13, wherein the second portion of the electric field generated by the focusing unit is closer to the anode than the cathode.

17. The method of claim 16, wherein the second portion of the electric field generated by the focusing unit is located in proximity to the opening in the anode.

18. The method of claim 13, wherein the first portion of the electric field is configured to accelerate electrons in the electron beam.

19. The method of claim 13, wherein the second portion of the electric field is configured to concentrate the electron beam.

20. The method of claim 13, further comprising positioning a sample for at least a portion of the electron beam to be incident on the sample after propagating through the opening, with the distance between the cathode and the sample less than about 1 cm.

21. The method of claim 13, wherein the electric field is configured to concentrate the electron beam to have a duration of less than about 100 femtoseconds.

22. The method of claim 13, wherein the electric field is configured to limit the divergence of the electron beam to less than about 3 milliradians.

23. The method of claim 13, wherein generating an electron beam from a material that includes metal comprises generating the electron beam from the laser radiation being incident on a coating on the transmission window.

* * * * *